(12) United States Patent
Iwamoto et al.

(10) Patent No.: US 8,405,415 B2
(45) Date of Patent: Mar. 26, 2013

(54) TEST APPARATUS SYNCHRONOUS MODULE AND SYNCHRONOUS METHOD

(75) Inventors: Satoshi Iwamoto, Saitama (JP); Koichi Yatsuka, Gunma (JP)

(73) Assignee: Advantest Corporation, Tokyo (JP)

( * ) Notice: Subject to any disclaimer, the term of this patent is extended or adjusted under 35 U.S.C. 154(b) by 238 days.

(21) Appl. No.: 12/557,478

(22) Filed: Sep. 10, 2009

(65) Prior Publication Data

US 2011/0057663 A1      Mar. 10, 2011

(51) Int. Cl.
*G01R 31/26* (2006.01)
(52) U.S. Cl. .................... 324/762.01; 324/73.1
(58) Field of Classification Search .......... None
See application file for complete search history.

(56) References Cited

U.S. PATENT DOCUMENTS

| | | | |
|---|---|---|---|
| 6,028,439 A | 2/2000 | Arkin et al. | |
| 7,237,167 B2 * | 6/2007 | Inaba et al. | 714/740 |
| 7,848,899 B2 * | 12/2010 | Lai et al. | 702/118 |
| 2004/0239310 A1 | 12/2004 | Oshima et al. | |
| 2006/0224926 A1 * | 10/2006 | Iwamoto | 714/38 |
| 2008/0221824 A1 * | 9/2008 | Kumaki | 702/118 |

FOREIGN PATENT DOCUMENTS

| | | |
|---|---|---|
| JP | 61-235770 A | 10/1986 |
| JP | H11-344528 A | 12/1999 |
| JP | 2001-522049 A | 11/2001 |
| JP | 2007-52028 A | 3/2007 |
| WO | 2003/062843 A1 | 7/2003 |
| WO | 2004/072670 A1 | 8/2004 |
| WO | WO 2006031185 A1 * | 3/2006 |

OTHER PUBLICATIONS

Japanese Office Action dated on Dec. 21, 2010, in a counterpart Japanese patent application of Application No. 2010-194111.
Evans, "The New ATE: Protocol Aware", Test Conference, IEEE International, Oct. 2007, pp. 1-10, Santa Clara, CA.
Japanese Office Action dated on Oct. 5, 2010, in a counterpart Japanese patent application of Application No. JP2010-194111.
The explanation of circumstances concerning the accelerated examination dated Aug. 31, 2010, in a counterpart Japanese patent application JP2010-194111 submitted to Japanese Patent Office. Concise Explanation of Relevance: This document cites Foreign Patent document No. 2 listed above.
The explanation of circumstances concerning the accelerated examination dated Aug. 31, 2010, for a counterpart Japanese patent application JP2010-194111 submitted to Japanese Patent Office has been submitted via previous IDS on Oct. 15, 2010. Concise explanation of relevance is submitted hereby. This submission is a partial translation of the explanation of circumstances concerning the accelerated examination states Foreign Patent document JP2001-522049, which have been submitted in a previous IDS.

* cited by examiner

Primary Examiner — Minh N Tang

(57) ABSTRACT

Provided is a test apparatus that tests a device under test, comprising a plurality of test modules that test the device under test; a synchronization module that is connected to each of the plurality of test modules, and that synchronizes the plurality of test modules; and a test control section that is connected to the plurality of test modules and the synchronization module, and that controls the test modules and the synchronization module. The synchronization module includes a receiving section that receives, from each of the plurality of test modules, a state signal indicating a state of the test module; an aggregating section that generates an aggregate state signal by calculating an aggregate of the state signals received by the receiving section; and a transmitting section that transmits, to the plurality of test modules, a control signal ordering an operation corresponding to the aggregate state signal.

22 Claims, 7 Drawing Sheets

TEST APPARATUS SYNCHRONOUS MODULE AND SYNCHRONOUS METHOD

BACKGROUND

1. Technical Field

The present invention relates to a test apparatus, a synchronization module, and a synchronization method.

2. Related Art

A test apparatus provided with a plurality of test circuits is known as an apparatus for testing a device under test such as a semiconductor chip as shown in, for example, International Publication Pamphlet No. 2003/062843 and Japanese Patent Application Publication No. 2007-52028. Here, the plurality of test circuits desirably operate in synchronization.

The plurality of test circuits of the test apparatus operate according to a pre-supplied program, sequence, or the like. The test apparatus causes all of the test circuits to operate in synchronization by initiating execution of the programs in synchronization.

When many tests are being performed, however, it is not enough to simply synchronize the timing of the initiation of the program for each test circuit. For example, while executing programs, a subsequent step may be desirably executed in synchronization after all of the test circuits have reached a stand-by state.

In this case, if each program is designed such that each test circuit requires the same amount of time to execute the corresponding and therefore reaches the stand-by state at simultaneously, the following tests can be performed in synchronization by synchronizing the initiation timing of the following programs. However, designing the programs in this way requires a great deal of time and effort.

SUMMARY

Therefore, it is an object of an aspect of the innovations herein to provide a test apparatus, a synchronization module, and a synchronization method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a plurality of test modules that test the device under test; a synchronization module that is connected to each of the plurality of test modules, and that synchronizes the plurality of test modules; and a test control section that is connected to the plurality of test modules and the synchronization module, and that controls the test modules and the synchronization module. The synchronization module includes a receiving section that receives, from each of the plurality of test modules, a state signal indicating a state of the test module; an aggregating section that generates an aggregate state signal by calculating an aggregate of the state signals received by the receiving section; and a transmitting section that transmits, to the plurality of test modules, a control signal ordering an operation corresponding to the aggregate state signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
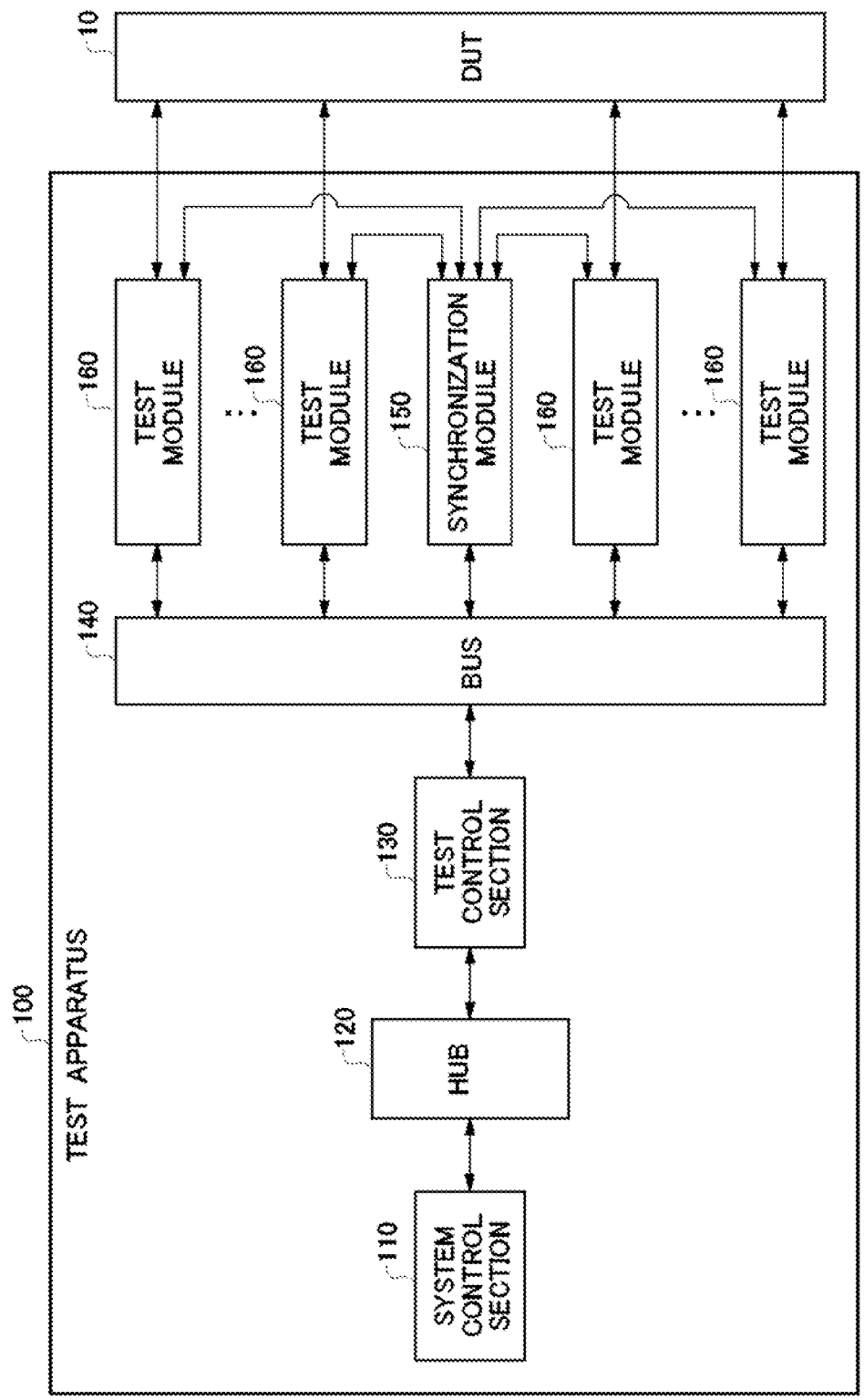
FIG. 1 shows a configuration of a test apparatus 100 according to an embodiment of the present invention, along with a device under test (DUT) 10.

FIG. 1 shows a configuration of a test apparatus 100 according to an embodiment of the present invention, along with a device under test (DUT) 10. The test apparatus 100 tests the device under test 10. The test apparatus 100 is provided with a system control section 110, a hub 120, a test control section 130, a bus 140, a synchronization module 150, and a plurality of test modules 160.

The system control section 110 performs overall control of the test apparatus 100. The hub 120 enables communication between the system control section 110 and the test control section 130. The hub 120 may be a general or specialized high-speed serial bus, for example.

The test control section 130 is connected to the synchronization module 150 and the plurality of test modules 160, and controls the synchronization module 150 and the test modules 160. More specifically, the test control section 130 controls the synchronization module 150 and the test modules 160 according to control instructions and test programs or the like supplied from the system control section 110, thereby testing the device under test 10. The bus 140 is electrically connected between (i) the test control section 130 and (ii) the synchronization module 150 and the test modules 160.

The synchronization module 150 is connected to each of the test modules 160 to synchronize the test modules 160. For example, in response to all of the test modules 160 reaching a preset state, the synchronization module 150 transmits a control signal to each test module 160 indicating a preset operation. Instead, the synchronization module 150 may transmit the control signal to each test module 160 indicating a preset operation in response to at least one of the test modules 160 reaching a preset state.

As yet another example, the synchronization module 150 may execute a predetermined program in response to at least one test module 160 or all of the test modules 160 reaching a preset state. The synchronization module 150 may then transmit, to each of the test modules 160, a control signal indicating an operation that corresponds to results of the executed program.

Each test module 160 includes a processor, sequencer, or the like for executing the test program. Each test module 160 sends and receives signals designated by the test program to and from the device under test 10, thereby testing the device under test 10. For example, each test module 160 may send and receive packets to and from the device under test 10 to test the device under test 10.

Upon reaching a state that is preset by the test, each test module 160 sends a state signal indicating that the preset state has been reached to the synchronization module 150. Upon receiving a control signal designating an operation from the synchronization module 150, each test module 160 performs the operation designated by the control signal.

The synchronization module 150 and the test modules 160 may be on a substrate loaded in the test head of the test apparatus 100. As another example, the synchronization module 150 and the test modules 160 may be connected by a cable or by wiring formed on a performance board loaded in the device under test 10.

Figure 2:
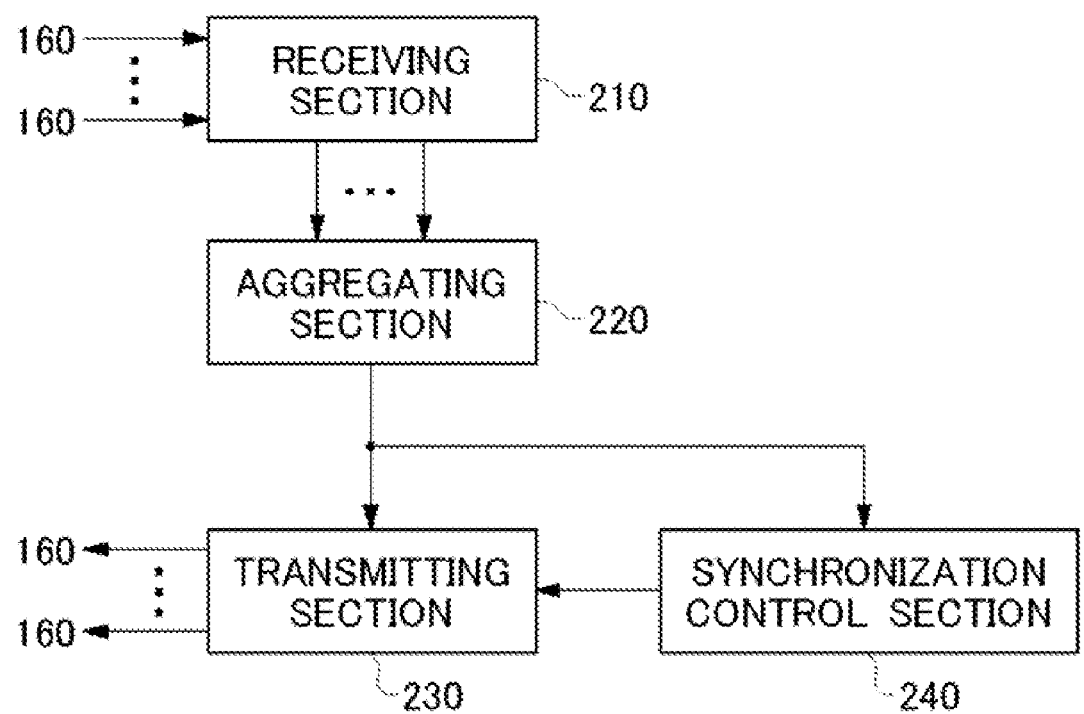
FIG. 2 shows a functional configuration of the synchronization module 150 according to the present embodiment.

FIG. 2 shows a functional configuration of the synchronization module 150 according to the present embodiment. The synchronization module 150 includes a receiving section 210, an aggregating section 220, a transmitting section 230, and a synchronization control section 240.

The receiving section 210 receives, from each of the test modules 160, a state signal indicating the sate of the corresponding test module 160. For example, the receiving section 210 receives, as a state signal, a command indicating the state of the corresponding test module 160.

The aggregating section 220 generates an aggregate state signal obtained as an aggregate of the state signals received by the receiving section 210. For example, the aggregating section 220 generates the aggregate state signal on a condition that the receiving section 210 has received the preset state signals from all of the test modules 160. As another example, the aggregating section 220 may generate the aggregate state signal on a condition that the receiving section 210 has received the preset state signals from one of the test modules 160.

The aggregating section 220 may generate the aggregate state signal for each of the states indicated by the state signals. Instead, the aggregating section 220 may generate the aggregate state signal for each piece of content in the command.

The aggregating section 220 interrupts the synchronization control section 240 in response to the generation of the aggregate state signal. For example, the aggregating section 220 may supply the synchronization control section 240 with an interrupt signal in response to generation of the aggregate state signal corresponding to the command including the preset content.

In response to the aggregating section 220 generating the aggregate state signal, the transmitting section 230 sends, to the test modules 160, a control signal designating an operation corresponding to the aggregate state signal. For example, the transmitting section 230 may send, to the test modules 160, a control signal indicating initiation of the preset operation. Instead, the transmitting section 230 may send, to the test modules 160, a control signal indicating stoppage of the preset operation.

The synchronization control section 240 includes a processor and a memory. The synchronization control section 240 receives an interrupt from the aggregating section 220 upon generation of the preset aggregate state signal. Upon receiving the interrupt, the processor of the synchronization control section 240 reads and performs a synchronization program, which is stored in the memory, corresponding to the aggregate state signal that caused the interrupt. The synchronization control section 240 causes the transmitting section 230 to transmit the control signal indicating an operation corresponding to the results of the executed program to the test modules 160.

The synchronization module 150 described above sends the control signal to each test module 160 in response to the test modules 160 reaching a certain state, and can therefore synchronize the plurality of test modules 160. For example, the synchronization module 150 may cause the test modules 160 to initiate a preset operation or to stop the operation on a condition that all of the test modules 160 have reached the preset state.

Instead, the synchronization module 150 may cause the test modules 160 to initiate a preset operation or to stop the operation on a condition that one of the test modules 160 has reached the preset state. Furthermore, the synchronization module 150 may execute the preset synchronization program on a condition that one or all of the test modules 160 have reached the preset state.

The synchronization module 150 may divide the plurality of test modules 160 into groups, and perform synchronization control for each group.

The transmitting section 230 of the synchronization module 150 may transmit a control signal indicating writing to a control register in each of the test modules 160. In this way, the synchronization module 150 can supply the control signal to the processor in each of the test modules 160.

The transmitting section 230 of the synchronization module 150 may send, to at least one of the test modules 160, a read request indicating reading of a state register that shows the states of the test module 160. The receiving section 210 of the synchronization module 150 may receive, from at least one of the test modules 160, a state signal as a read response to the read request. In this way, the synchronization module 150 can receive a state signal from a processor in a test module 160.

Figure 3:
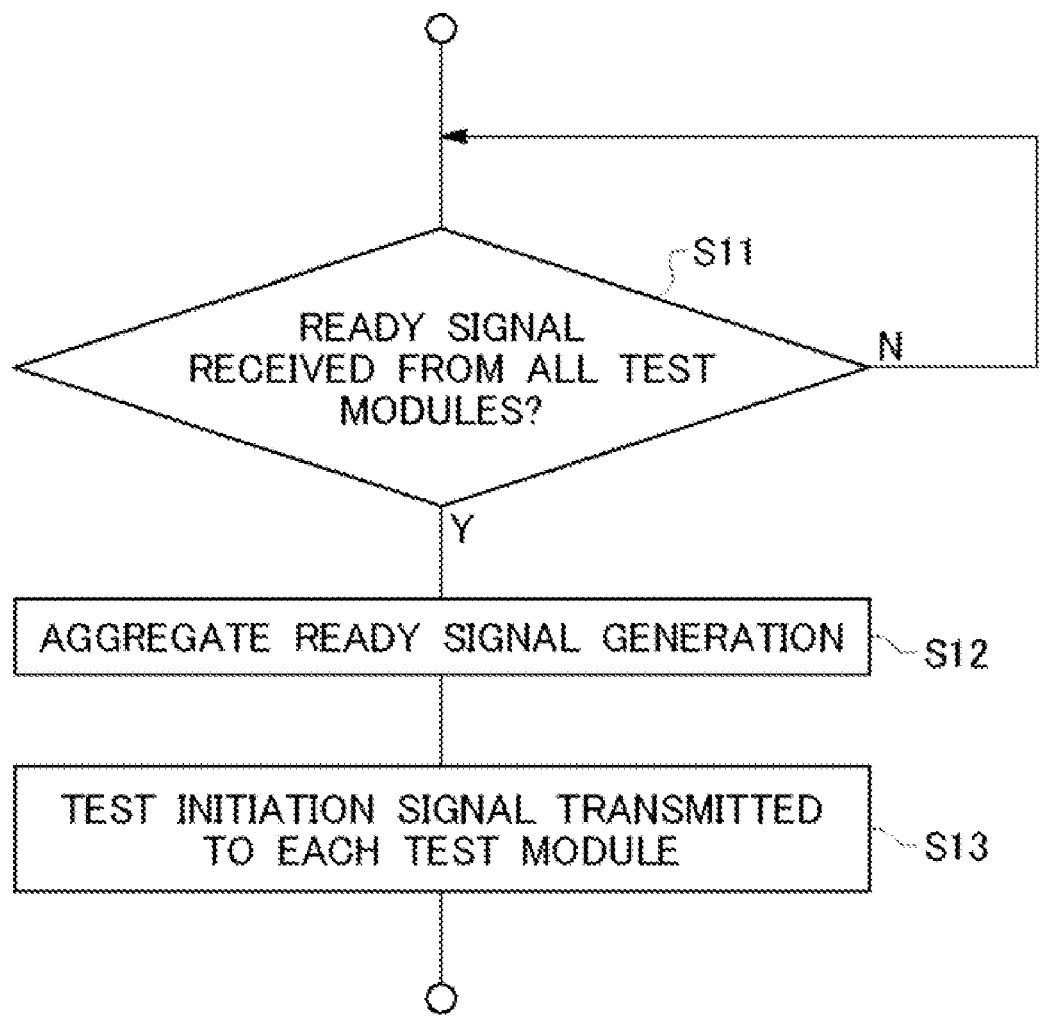
FIG. 3 shows a first exemplary process flow of the synchronization module 150 according to the present embodiment.

FIG. 3 shows a first exemplary process flow of the synchronization module 150 according to the present embodiment. Each test module 160 may send, to the synchronization module 150, a state signal that is a ready signal indicating that the test module 160 is in a ready state, in response to the test module 160 being in a ready state, i.e. a state in which the preparation for initiation of the operation has been completed.

In this case, the receiving section 210 of the synchronization module 150 receives a ready signal from each of the test modules 160. When the receiving section 210 receives a ready signal, the aggregating section 220 determines whether ready signals have been received from all of the test modules 160 (S11). If the aggregating section 220 determines that ready signals have not been received from all of the test modules 160 (the "N" of S11), the process remains at step S11 until the receiving section 210 receives the next ready signal.

If the aggregating section 220 determines that ready signals have been received from all of the test modules 160 (the "Y" of S12), the aggregating section 220 generates, as one type of aggregate state signal, an aggregate ready signal indicating that the test modules 160 have reached the ready state (S12). Next, the transmitting section 230 sends, to each of the test modules 160, a test initiation signal indicating test initiation, in response to the generation of the aggregate ready signal (S13).

Upon receiving the test initiation signal from the synchronization module 150, each test module 160 begins the preset test. For example, upon receiving the test initiation signal from the synchronization module 150, each test module 160 transmits, to the device under test 10, the preset pattern or packet. In this way, the test apparatus 100 can begin testing with the test modules 160 in synchronization without performing a complex timing control according to the test program.

Figure 4:
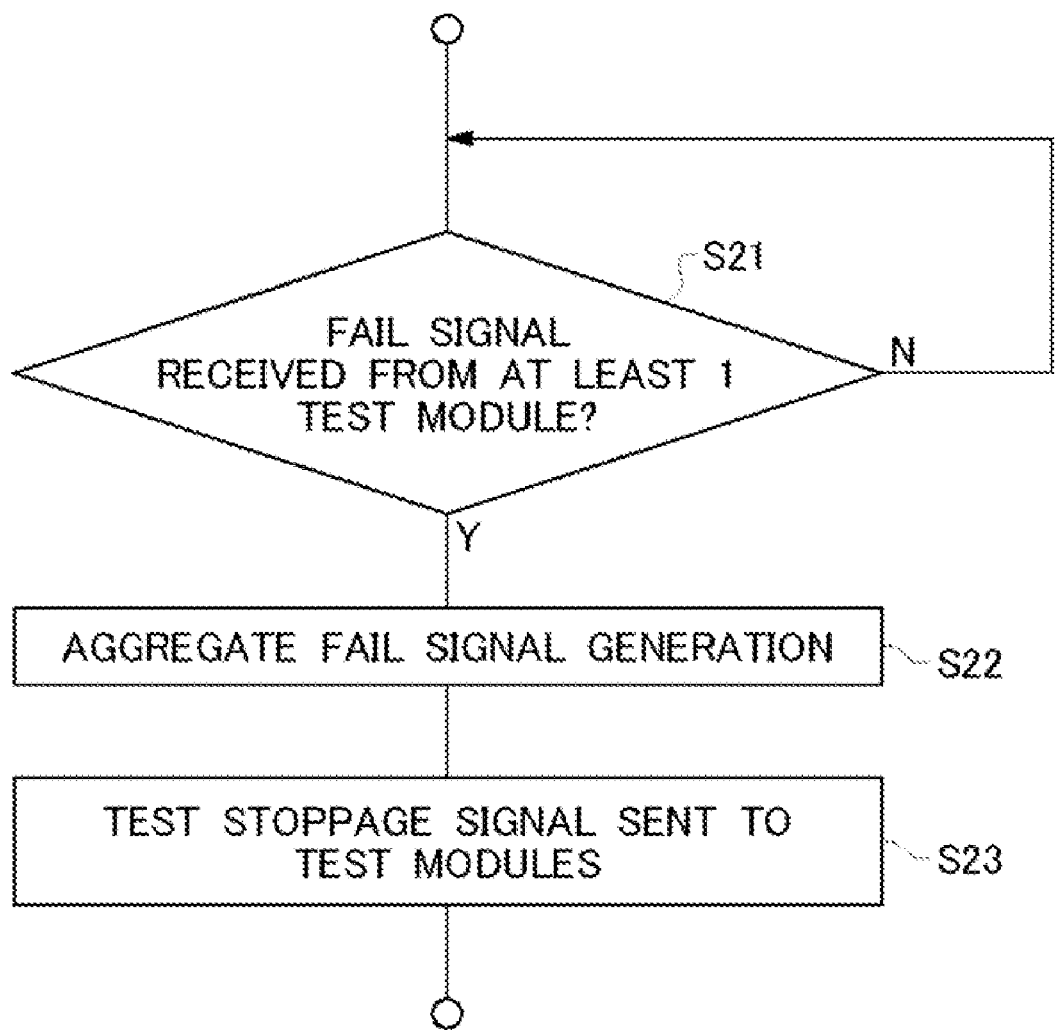
FIG. 4 shows a second exemplary process flow of the synchronization module 150 according to the present embodiment.

FIG. 4 shows a second exemplary process flow of the synchronization module 150 according to the present embodiment. Each test module 160 may send, to the synchronization module 150, a state signal that is a fail signal indicating that the test by the test module 160 has failed, in response to a failure occurring in the test.

In this case, the receiving section 210 of the synchronization module 150 receives fail signals from each of the test modules 160. First, the aggregating section 220 determines whether a fail signal has been received from at least one of the test modules 160 (S21). If the aggregating section 220 determines that a fail signal has not been received from any of the test modules 160 (the "N" of S21), the process remains at step S21.

If the aggregating section 220 determines that a fail signal has been received from at least one of the test modules 160 (the "Y" of S22), the aggregating section 220 generates, as one type of aggregate state signal, an aggregate fail signal indicating that a test has failed (S22). Next, the transmitting section 230 sends, to each of the test modules 160, a test stoppage signal that indicates stoppage of the test, in response to the generation of the aggregate fail signal (S23).

Upon receiving the test stoppage signal from the synchronization module 150, each test module 160 stops the test that is currently being executed. In this way, the test apparatus 100 can simultaneously stop testing by the test modules 160 without using a complex timing control according to the test program.

Figure 5:
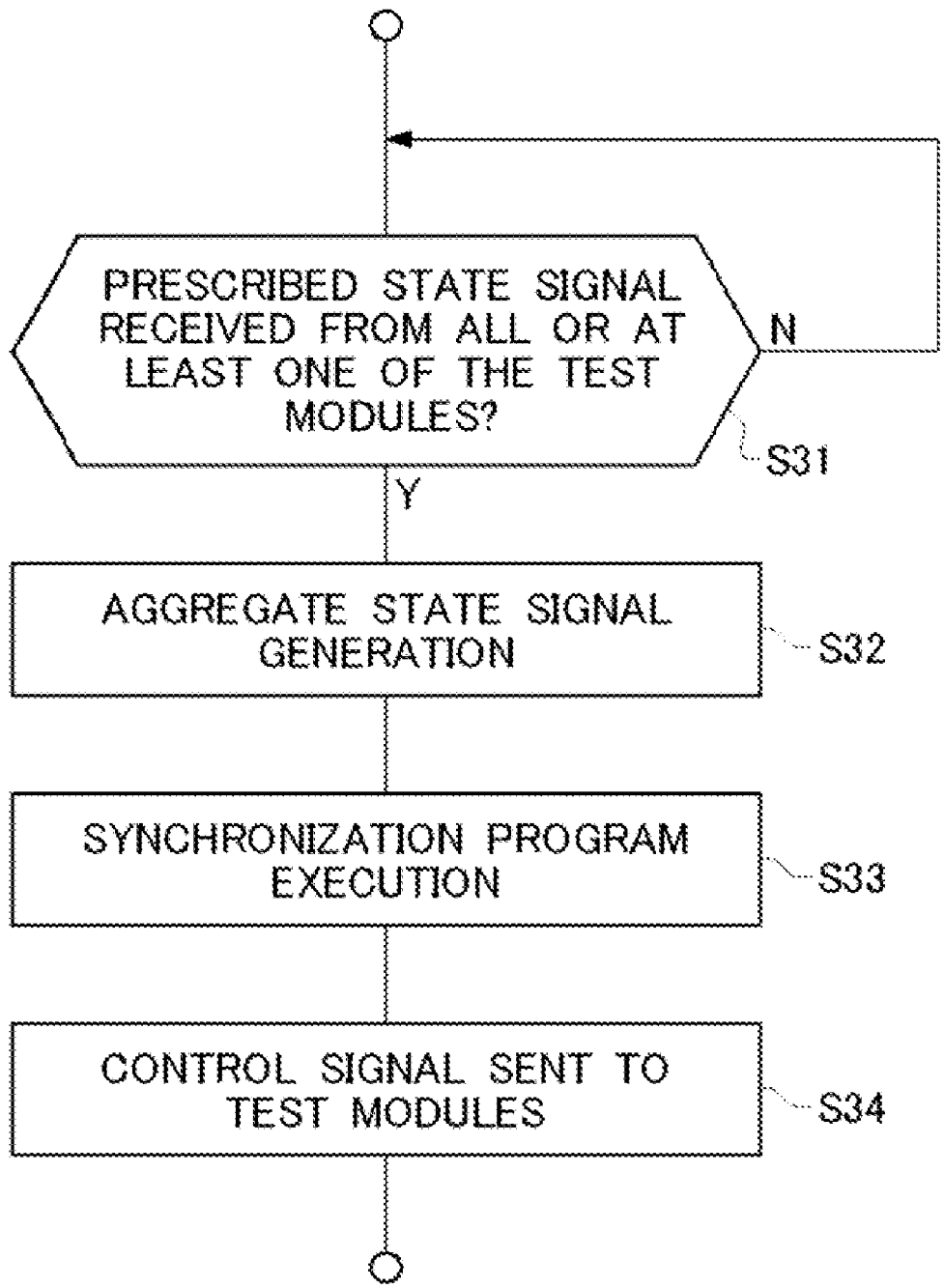
FIG. 5 shows a third exemplary process flow of the synchronization module 150 according to the present embodiment.

FIG. 5 shows a third exemplary process flow of the synchronization module 150 according to the present embodiment. Each test module 160 may send, to the synchronization module 150, a state signal indicating that a preset state has been reached, in response to the test module 160 reaching the preset state.

The receiving section 210 of the synchronization module 150 receives a preset state signal from each of the test modules 160. First, the aggregating section 220 determines whether preset state signals have been received from all of the test modules 160 or from at least one of the test modules 160 (S31). If the aggregating section 220 determines that preset state signals have not been received from all of the test modules 160 or from at least one of the test modules 160 (the "N" of S31), the process remains at step S31.

If the aggregating section 220 determines that preset state signals have been received from all of the test modules 160 or from at least one of the test modules 160 (the "Y" of S32), the aggregating section 220 generates an aggregate state signal obtained as an aggregate of the preset state signals (S32). Next, the aggregating section 220 supplies the synchronization control section 240 with an interrupt signal in response to the generation of the preset aggregate state signal.

Upon receiving the interrupt signal, the synchronization control section 240 executes a synchronization program corresponding to the preset aggregate state signal (S33). The synchronization control section 240 sends, to each of the test modules 160, a control signal indicating an operation corresponding to the results obtained from the execution of the synchronization program (S34).

Upon receiving the control signal from the synchronization module 150, each test module 160 executes the operation indicated by the control signal. In this way, the test apparatus 100 can execute a common program in synchronization without using a complex timing control.

Figure 6:
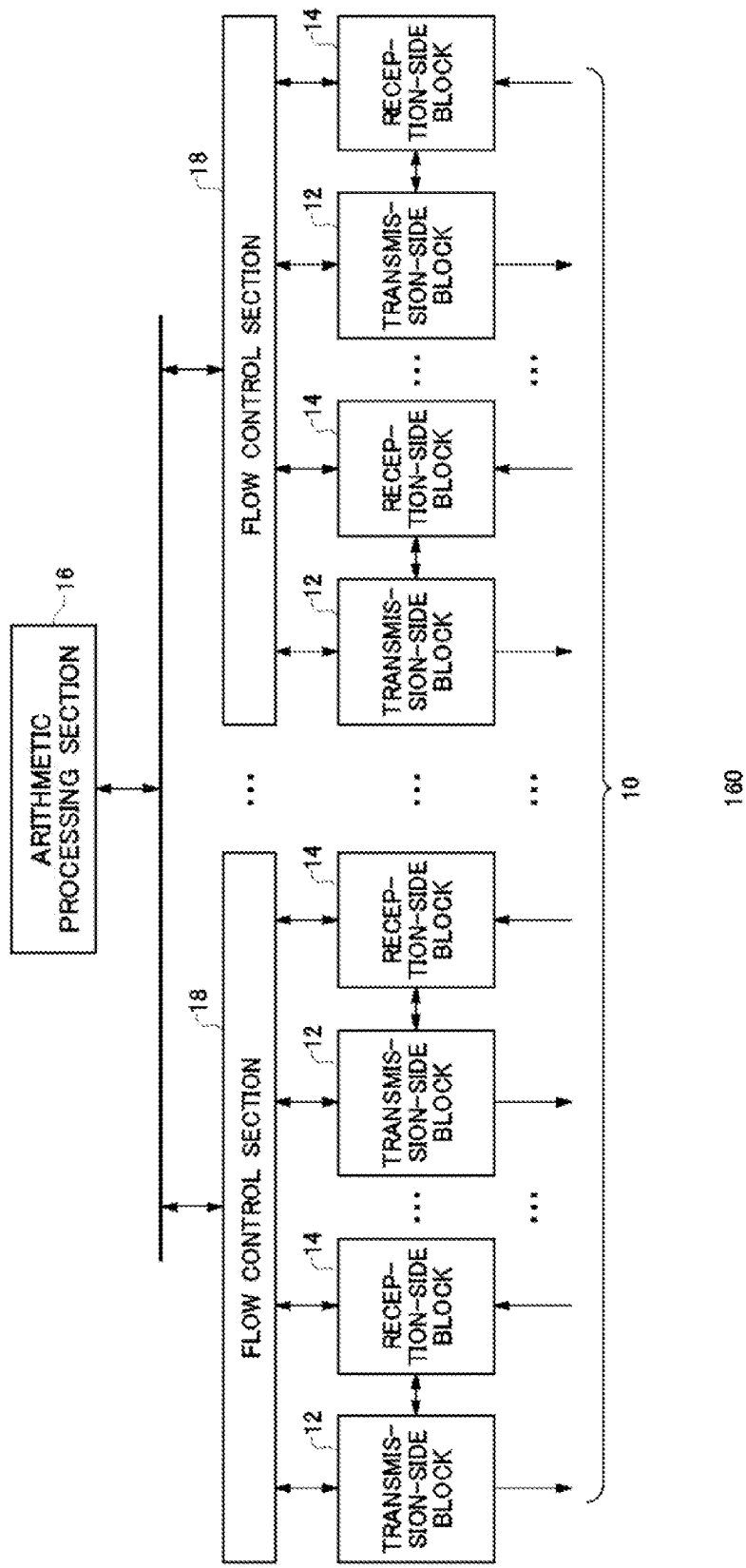
FIG. 6 shows an exemplary configuration of the test module 160 according to the present embodiment.

FIG. 6 shows an exemplary configuration of the test module 160 according to the present embodiment. The test module 160 tests the device under test 10 by transmitting and receiving packets to and from the device under test 10 according to a test program.

The test module 160 may include a plurality of transmission-side blocks 12, a plurality of reception-side blocks 14, an arithmetic processing section 16, and a plurality of flow control sections 18. In the present embodiment, the test module 160 includes 128 transmission-side blocks 12, 128 reception-side blocks 14, one arithmetic processing section 16, and eight flow control sections 18.

Each transmission-side block 12 and each reception-side block 14 are respectively connected to a terminal of the device under test 10. Each transmission-side block 12 is associated with one reception-side block 14. Each pair of a transmission-side block 12 and a reception-side block 14 corresponds to a flow control section 18. In the present embodiment, eight pairs of a transmission-side block 12 and a reception-side block 14 are associated with each flow control section 18, and there are a total of eight flow control sections 18.

Each pair of a transmission-side block 12 and a reception-side block 14 stores a plurality of packet lists that each include a series of packets to be transmitted to and received from the device under test 10. Each pair of a transmission-side block 12 and a reception-side block 14 sequentially sends and receives, to and from the device under test 10, series of packets that are included in the packet list designated by the corresponding flow control section 18.

The arithmetic processing section 16 performs an operational expression included in the test program. For example, the arithmetic processing section 16 receives an argument of an operational expression from each flow control section 18, calculates the operational expression based on the received argument, and supplies the result to the corresponding flow control section 18.

The flow control section 18 designates the execution order of the packet list for each of the corresponding pairs of a transmission-side block 12 and a reception-side block 14, based on the execution flow of the test program. For example, the flow control section 18 performs branch instructions, subroutine call instructions, and the like in the test program, and designate the next packet list to be executed for the corresponding pair of a transmission-side block 12 and a reception-side block 14 according to the execution results of these instructions.

As another example, the flow control section 18 may receive results of communication with the device under test 10 from the corresponding pair of a transmission-side block 12 and a reception-side block 14, and send the received communication results to the arithmetic processing section 16 as an argument of an operational expression. As yet another example, the flow control section 18 may receive the computation result of an operational expression from the arithmetic processing section 16, and designate the next packet list to be executed for the corresponding pair of a transmission-side block 12 and a reception-side block 14 according to the received computation result.

The test apparatus 100 described above causes the upper-level arithmetic processing section 16 to perform an operational function in a test program, and thereby exert flow control over the flow control sections 18, transmission-side blocks 12, and reception-side blocks 14, which are lower-level. In this way, the test apparatus 100 can perform centralized control of the variables by realizing the upper-level arithmetic processing section 16 as a processor with high computational power, and can realize the lower-level devices, i.e. the flow control sections 18, the transmission-side blocks 12, and the reception-side blocks 14, as sequencers or processors with high operational frequencies. Such a configuration achieves a system with good overall efficiency.

Furthermore, when the communication with the device under test 10 involves a plurality of identical packets, the test apparatus 100 can generate a data sequence by designating common data a plurality of times. In this way, the device under test 10 can decrease the amount of data stored therein.

Figure 7:
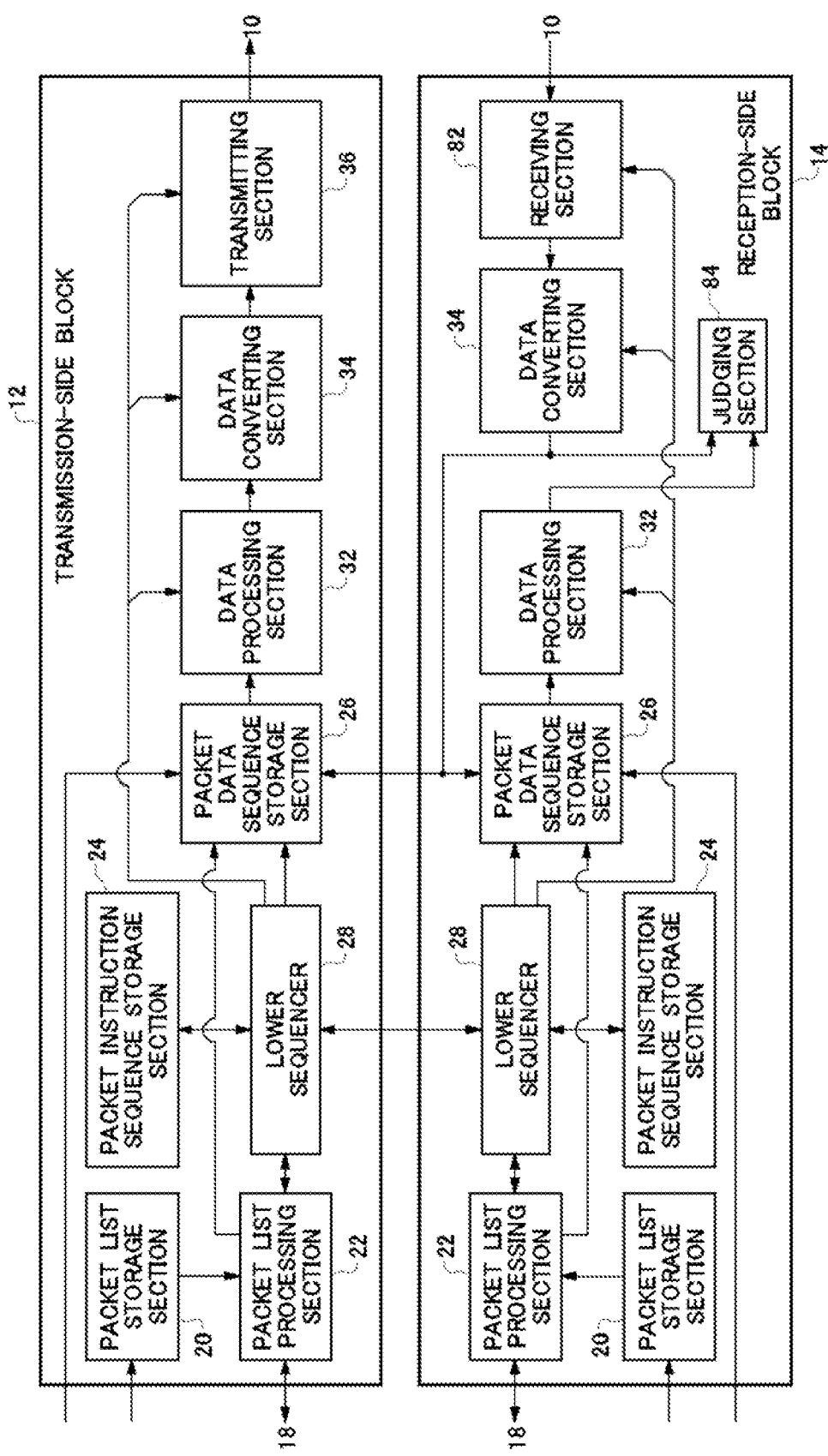
FIG. 7 shows an exemplary configuration of a transmission-side block 12 and a reception-side block 14 according to the present embodiment.

FIG. 7 shows an exemplary configuration of a transmission-side block 12 and a reception-side block 14 according to the present embodiment. The transmission-side block 12 sends packets to the device under test 10 in the order designated by the packet list. The reception-side block 14 receives packets from the device under test 10, compares the received packets to the packets designated by the packet list, and judges acceptability of the device under test 10 based on the comparison results.

The transmission-side block 12 is described first. The transmission-side block 12 includes a packet list storing section 20, a packet list processing section 22, a packet instruction sequence storing section 24, a packet data sequence storing section 26, a lower sequencer 28, a data processing section 32, a data converting section 34, and a transmitting section 36. The packet list storing section 20 stores a plurality of packet lists supplied thereto.

The packet list processing section 22 executes a packet list designated by the flow control section 18 from among the packet lists stored in the packet list storing section 20, to sequentially designate each packet to be sent to the device under test 10. For example, the packet list processing section 22 executes the packet list from an address received from the flow control section 18, and sequentially designates the packets to be sent to the device under test 10.

The packet list processing section 22 may designate an address in the packet instruction sequence storing section 24 in which an instruction sequence for generating the designated packet is stored. Furthermore, the packet list processing section 22 may designate, in the packet data sequence storing section 26, an address of a data sequence, such as a leading address of a data sequence, included in the packet to be sent to the device under test 10.

In this way, the packet list processing section 22 can individually designate the address of an instruction sequence for generating a packet and the address of a data sequence included in the packet. In this case, if the packet list includes designation of a data sequence or instruction sequence common to two or more packets, the packet list processing section 22 may designate the address of the same instruction sequence or the address of the same data sequence for the two or more packets.

The packet instruction sequence storing section 24 stores an instruction sequences for respectively generating each of a plurality of types of packets. For example, the packet instruction sequence storing section 24 may store an instruction sequence for generating a write packet, an instruction sequence for generating a read packet, an instruction sequence for generating an idle packet, and the like.

The packet data sequence storing section 26 stores data sequences that respectively include each type of packet. For example, the packet data sequence storing section 26 may store a data sequence including a write packet, a data sequence including a read packet, a data sequence including an idle packet, and the like. The packet data sequence storing section 26 may store individual data that is changed for each packet and common data that is common to all types of packets, in separate storage regions.

The transmission-side packet data sequence storing section 26 receives reception data included in packets received from the data converting section 34 in the reception-side block 14 by the receiving section 82 in the reception-side block 14. The transmission-side packet data sequence storing section 26 stores the reception data included in the packets received by the receiving section 82 of the reception-side block 14.

The lower sequencer 28 reads, from the packet instruction sequence storing section 24, the instruction sequence of the packet designated by the packet list processing section 22, i.e. the instruction sequence whose address is designated by the packet list processing section 22, and sequentially executes the instructions included in the read instruction sequence. Furthermore, the lower sequencer 28 sequentially outputs, from the packet data sequence storing section 26, the data sequence of the packet designated by the packet list processing section 22, i.e. the data sequence whose address is designated by the packet list processing section 22, according to the executed instruction sequence, thereby generating the test data sequence for testing the device under test 10.

Furthermore, for each instruction executed, the lower sequencer 28 supplies the data processing section 32 and the data converting section 34 with control data designating application of a designated process, such as a computation or data conversion, to the read individual data and common data. In this way, the lower sequencer 28 causes a designated data portion in the packet designated by the packet list processing section 22 to be the data obtained by applying the designated process to the read data.

The lower sequencer 28 may supply the packet list processing section 22 with a completion notification upon completing the execution of the instruction sequence of the packet designated by the packet list processing section 22. In this way, the packet list processing section 22 can sequentially designate packets according to the progression of the instruction sequence execution by the lower sequencer 28.

The transmission side lower sequencer 28 in the transmission-side block 12 designates, for the transmitting section 36, an edge timing of the signal sent to the device under test 10. For example, the lower sequencer controls the edge timing for each packet by supplying a timing signal to the transmitting section 36.

The transmission-side lower sequencer 28 communicates with the reception-side lower sequencer 28 in the reception-side block 14. In this way, the transmission-side lower sequencer 28 can perform a handshake with the reception-side lower sequencer 28 to execute the instruction sequences in synchronization with the reception-side lower sequencer 28.

The transmission-side lower sequencer 28 may notify the reception-side lower sequencer 28 that the test data of a predesignated test packet has been sent to the device under test 10. In this way, the transmission-side lower sequencer 28 can prohibit acceptability judgment of the received data by the reception-side lower sequencer 28 until the notification is received from the transmission-side lower sequencer 28.

The transmission-side lower sequencer 28 may receive notification from the reception-side lower sequencer 28 that a data sequence matching the generated test data sequence has been received, and then generate the test data sequence of the predesignated packet. In this way, after receiving the prescribed packet from the device under test 10, the transmission-side lower sequencer 28 can send the predesignated packet to the device under test 10.

The data processing section 32 reads the data sequence of the packet designated by the packet list processing section 22 from the packet data sequence storing section 26 to generate the test data sequence for testing the device under test 10. In this case, the transmission-side data processing section 32 may include, in the test data sequence corresponding to the packet transmitted to the device under test 10, a value corresponding to the received data included in the packet received by the receiving section 82 in the reception-side block 14.

For example, the transmission-side data processing section 32 may read the data from the transmission-side packet data sequence storing section 26, and generate a test data sequence causing the predesignated portion in the data sequence of the packet sent to the device under test 10 to be a value corresponding to the reception data, that is, causing the reception data to be its original value or a value obtained by applying some process to the reception data. The transmission-side data processing section 32 can therefore send a packet that includes a value corresponding to the reception data included in the packet received from the device under test 10.

The data converting section 34 performs data conversion on the test data sequence output from the data processing section 32, at a timing designated by the lower sequencer 28. For example, the data converting section 34 performs an 8b-10b conversion on the test data sequence using a predesignated table or the like. Furthermore, the data converting section 34 may scramble the test data pattern. The data converting section 34 then outputs the converted data sequence.

The transmitting section 36 transmits, to the device under test 10, the test data sequence generated by the data converting section 34.

The following is a description of the reception-side block 14. The reception-side block 14 adopts the same function and configuration as the transmission-side block 12, and therefore the following description includes only differing points.

The reception-side block 14 includes the packet list storing section 20, the packet list processing section 22, the packet instruction sequence storing section 24, the packet data sequence storing section 26, the lower sequencer 28, the data processing section 32, the data converting section 34, a receiving section 82, and a judging section 84. The receiving section 82 receives the data sequence of a packet from the device under test 10.

The reception-side data converting section 34 performs data conversion on the data sequence received by the receiving section 82, at a timing designated by the reception-side lower sequencer 28. For example, the reception-side data converting section 34 performs an 8b-10b conversion on the received data sequence using a predesignated table or the like. Furthermore, the reception-side data converting section 34 may scramble the received data pattern.

The reception-side data converting section 34 then supplies the converted data sequence to the judging section 84. Instead, the reception-side data converting section 34 may supply the converted data sequence to at least one of the reception-side packet data sequence storing section 26 and the transmission-side packet data sequence storing section 26.

The reception-side packet list processing section 22 executes the packet list designated by the flow control section 18, thereby sequentially designating the packets that are expected to be received from the device under test 10. The reception-side data processing section 32 may supply the generated test data sequence to the judging section 84.

The reception-side lower sequencer 28 outputs, from the reception-side packet data sequence storing section 26 as the test data sequence, the data sequence of the packet expected to be output from the device under test 10. The reception-side lower sequencer 28 designates, for the receiving section 82, a strobe timing for acquiring the data value of the signal output from the device under test 10.

The judging section 84 receives the test data sequence from the reception-side data processing section 32, and also receives the data sequence from the reception-side data converting section 34. The judging section 84 judges the acceptability of the communication with the device under test 10 based on the result of a comparison between the received data sequence and the test data sequence. For example, the judging section 84 includes a logic comparing section that compares the data sequence received by the receiving section 82 to the test data sequence, and a fail memory that stores the comparison result. The judging section 84 may notify the reception-side lower sequencer 28 when the data sequence received by the receiving section 82 matches the designated data sequence.

The reception-side lower sequencer 28 communicates with the transmission-side lower sequencer 28. In this way, the reception-side lower sequencer 28 can execute the instruction sequences in synchronization with the transmission-side lower sequencer 28 by performing a handshake with the transmission-side lower sequencer 28.

The reception-side lower sequencer 28 may notify the transmission-side lower sequencer 28 when a data sequence is received that matches the test data sequence generated by the reception-side lower sequencer 28. In this way, the transmission-side lower sequencer 28 can receive notification from the reception-side lower sequencer 28 that a data sequence matching the generated test data sequence has been received, and can then generate the test data sequence of the predesignated packet.

The reception-side lower sequencer 28 may prohibit the judging section 84 from judging acceptability of the data received by the receiving section 82 until notification is received from the transmission-side lower sequencer 28 that the test data sequence of the predesignated packet has been sent to the device under test 10. In this way, after sending the prescribed packet to the device under test 10, the reception-side lower sequencer 28 can judge whether the device under test 10 has output a response corresponding to the prescribed packet.

The reception-side packet data sequence storing section 26 receives reception data included in the packet received by the receiving section 82 from the data converting section 34 in the reception-side block 14. The reception-side packet data sequence storing section 26 stores the reception data included in the packet received by the receiving section 82.

The reception-side data processing section 32 may include, in the test data sequence included in the packet that is expected to be output by the device under test 10, a value corresponding to the reception data included in the packet that has been received by the receiving section 82. For example, the reception-side data processing section 32 may read data from the reception-side packet data sequence storing section 26, and generate a test data sequence causing the predesignated portion in the data sequence of the packet expected to be received from the device under test 10 to be a value corresponding to the reception data, that is, causing the reception data to be its original value or a value obtained by applying some process to the reception data.

The reception-side data processing section 32 may include, in the test data sequence corresponding to a second packet to be received from the device under test 10, a value corresponding to the reception data included in a first packet already received by the receiving section 82. In this way, the reception-side data processing section 32 can reference an ID or the like included in the packet received from the device under test 10, and judge whether the ID to be included in the following packets is correct.

As described above, the test apparatus 100 of the present embodiment can perform a process to include (i) a value corresponding to reception data in a received packet in (ii) the following packets, at a position relatively near the device under test 10. In this way, the test apparatus 100 can speed-up the response time for communication with the device under test 10.

Furthermore, the test apparatus 100 is desirably provided with a data processing section 32 realized by a computational processing unit or the like with a relatively high operational frequency. In this way, the test apparatus 100 can perform a high-speed process for generating data included in subsequent packets based on data included in a received packet.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments, added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
   a processor;
   a memory in communication with the processor;
   a plurality of test modules that test the device under test;
   a synchronization module in communication with the processor and connected to each of the plurality of test modules, and that synchronizes the plurality of test modules; and
   a test control section that is connected to the plurality of test modules and the synchronization module, and that controls the test modules and the synchronization module, wherein
   the synchronization module includes:
      a receiving section in communication with the memory that receives, from each of the plurality of test modules, a ready signal indicating that the test module is in a ready state;
      an aggregating section in communication with the memory that generates an aggregate ready signal indicating that the plurality of test modules are in the ready state, on a condition that ready signals have been received from all of the plurality of test modules; and
      a transmitting section in communication with the memory that transmits, to each of the plurality of test modules, a common synchronization signal ordering test initiation, in response to the generation of the aggregate ready signal, such that the test modules are commonly synchronized.

2. The test apparatus according to claim 1, wherein
the transmitting section transmits the synchronization signal ordering writing to a control register in each of the plurality of test modules.

3. The test apparatus according to claim 2, wherein
the transmitting section transmits, to at least one of the test modules, a read request signal ordering reading of a state register that indicates the state of the test module, and
the receiving section receives, from the at least one test module, the ready signal as a read response to the read request.

4. The test apparatus according to claim 1, wherein
the synchronization module includes a synchronization control section, which executes a synchronization program stored in the memory corresponding to the aggregate ready signal to cause the transmitting section to transmit, to the plurality of test modules, the common synchronization signal ordering an operation corresponding to a result of the execution.

5. The test apparatus according to claim 4, wherein
the aggregating section interrupts the synchronization control section in response to the generation of a predetermined aggregate ready signal, and
upon receiving the interrupt, the synchronization control section executes the synchronization program corresponding to the aggregate ready signal that caused the interrupt.

6. A test apparatus that tests a device under test, comprising:
   a processor;
   a memory in communication with the processor;
   a plurality of test modules that test the device under test;
   a synchronization module in communication with the processor and connected to each of the plurality of test modules, and that synchronizes the plurality of test modules; and
   a test control section that is connected to the plurality of test modules and the synchronization module, and that controls the test modules and the synchronization module, wherein
   the synchronization modules includes:
      a receiving section in communication with the memory that receives, from at least one of the plurality of test modules, a fail signal indicating that a failure has occurred in the test by the test module;
      an aggregating section in communication with the memory that generates an aggregate fail signal indicating that a test has failed, on a condition that a fail signal is received from at least one of the plurality of test modules; and
      a transmitting section in communication with the memory that transmits, to each of the plurality of test modules, a common synchronization signal ordering stoppage of the test, in response to the generation of the aggregate fail signal, such that the test modules are commonly synchronized.

7. The test apparatus according to claim 6, wherein
the transmitting section transmits the synchronization signal ordering writing to a control register in each of the plurality of test modules.

8. The test apparatus according to claim 7, wherein
the transmitting section transmits, to at least one of the test modules, a read request signal ordering reading of a state register that indicates the state of the test module, and
the receiving section receives, from the at least one test module, the fail signal as a read response to the read request.

9. The test apparatus according to claim 6, wherein
the synchronization module includes a synchronization control section, which executes a synchronization program stored in the memory corresponding to the aggregate fail signal to cause the transmitting section to transmit, to the plurality of test modules, the common synchronization signal ordering an operation corresponding to a result of the execution.

10. The test apparatus according to claim 9, wherein
the aggregating section interrupts the synchronization control section in response to the generation of a predetermined aggregate fail signal, and
upon receiving the interrupt, the synchronization control section executes the synchronization program corresponding to the aggregate fail signal that caused the interrupt.

11. A synchronization module for use with a test apparatus that tests a device under test, the synchronization module comprising:
a memory;
a receiving section that receives, from each of the plurality of test modules, a ready signal indicating that the test module is in a ready state;
an aggregating section that generates an aggregate ready signal indicating that the plurality of test modules are in the ready state, on a condition that ready signals have been received from all of the plurality of test modules; and
a transmitting section that transmits, to each of the plurality of test modules, a common synchronization signal ordering test initiation, in response to the generation of the aggregate ready signal, such that the test modules are commonly synchronized.

12. A synchronization method for testing a device under test with a test apparatus that includes (i) a plurality of test modules that test the device under test, (ii) a synchronization module that is connected to each of the plurality of test modules, and that synchronizes the plurality of test modules, and (iii) a test control section that is connected to the plurality of test modules and the synchronization module, and that controls the test modules and the synchronization module, the synchronization method comprising:
the synchronization module receiving, from at least one of the plurality of test modules, a ready signal indicating that the test module is in a ready state,
the synchronization module generating an aggregate ready signal indicating that the plurality of test modules are in the ready state, on a condition that ready signals have been received from all of the plurality of test modules, and
the synchronization module transmitting, to each of the plurality of test modules, a common synchronization signal ordering test initiation, in response to the generation of the aggregate ready signal, such that the test modules are commonly synchronized.

13. The synchronization method according to claim 12, wherein
the synchronization module transmits the synchronization signal ordering writing to a control register in each of the plurality of test modules.

14. The synchronization method according to claim 13, wherein
the synchronization module transmits, to at least one of the test modules, a read request signal ordering reading of a state register that indicates the state of the test module, and
the synchronization module receives, from the at least one test module, the ready signal as a read response to the read request.

15. The synchronization method according to claim 12, wherein
the synchronization module executes a synchronization program corresponding to the aggregate ready signal to cause the synchronization module to transmit, to the plurality of test modules, the common synchronization signal ordering an operation corresponding to a result of the execution.

16. The synchronization method according to claim 15, wherein
upon receiving an interrupt in response to the generation of a predetermined aggregate ready signal, the synchronization module executes the synchronization program corresponding to the aggregate ready signal that caused the interrupt.

17. A synchronization method for testing a device under test with a test apparatus that includes (i) a plurality of test modules that test the device under test, (ii) a synchronization module that is connected to each of the plurality of test modules, and that synchronizes the plurality of test modules, and (iii) a test control section that is connected to the plurality of test modules and the synchronization module, and that controls the test modules and the synchronization module, the synchronization method comprising:
the synchronization module receiving, from each of the plurality of test modules, a fail signal indicating that a failure has occurred in the test by the test module,
the synchronization module generating an aggregate fail signal indicating that a test has failed, on a condition that a fail signal is received from at least one of the plurality of test modules, and
the synchronization module transmitting, to each of the plurality of test modules, a common synchronization signal ordering stoppage of the test, in response to the generation of the aggregate fail signal, such that the test modules are commonly synchronized.

18. The synchronization method according to claim 17, wherein
the synchronization module transmits the synchronization signal ordering writing to a control register in each of the plurality of test modules.

19. The synchronization method according to claim 18, wherein
the synchronization module transmits, to at least one of the test modules, a read request signal ordering reading of a state register that indicates the state of the test module, and
the synchronization module receives, from the at least one test module, the fail signal as a read response to the read request.

20. The synchronization method according to claim 17, wherein
the synchronization module executes a synchronization program corresponding to the aggregate fail signal to cause the synchronization module to transmit, to the plurality of test modules, the common synchronization signal ordering an operation corresponding to a result of the execution.

21. The synchronization method according to claim 20, wherein
upon receiving an interrupt in response to the generation of a predetermined aggregate fail signal, the synchronization module executes the synchronization program corresponding to the aggregate fail signal that caused the interrupt.

22. A synchronization module for use with a test apparatus that tests a device under test, the synchronization module comprising:

a memory;

a receiving section that receives, from each of the plurality of test modules, a fail signal indicating that a failure has occurred in the test by the test module;

an aggregating section that generates an aggregate fail signal indicating that a test has failed, on a condition that a fail signal is received from at least one of the plurality of test modules; and a transmitting section that transmits, to each of the plurality of test modules, a common synchronization signal ordering stoppage of the test, in response to the generation of the aggregate fail signal, such that the test modules are commonly synchronized.

* * * * *